US006160217A

United States Patent [19]

Auclair

[11] Patent Number: 6,160,217

[45] Date of Patent: Dec. 12, 2000

[54] ISOLATION GROUND ASSEMBLY

[75] Inventor: William T. Auclair, Winsted, Conn.

[73] Assignee: Electric Motion Company, Inc., Winsted, Conn.

[21] Appl. No.: 09/222,431

[22] Filed: Dec. 28, 1998

[51] Int. Cl.[7] .......... H05K 5/02

[52] U.S. Cl. .......... 174/51; 174/59; 174/35 C; 174/6; 439/98; 361/799

[58] Field of Search .......... 174/51, 59, 60, 174/6, 35 C, 135, 40 CC; 439/98, 100; 361/799

[56] References Cited

U.S. PATENT DOCUMENTS

| | | | |
|---|---|---|---|
| 4,882,647 | 11/1989 | Collins | 361/119 |
| 5,519,169 | 5/1996 | Garrett et al. | 174/35 R |
| 5,602,534 | 2/1997 | Granat | 340/572.1 |
| 5,805,429 | 9/1998 | Andersson | 361/799 |
| 5,909,005 | 6/1999 | Boston | 174/6 |
| 5,942,725 | 8/1999 | Daoud | 174/51 |

FOREIGN PATENT DOCUMENTS

| | | | |
|---|---|---|---|
| 1260129 | 9/1989 | Canada | 174/51 |
| 2194860 | 3/1988 | United Kingdom | 174/51 |

OTHER PUBLICATIONS

Lite Industries Inc., "Universal Isolation Terminal Kit," Item: UIT–11415 No Date.

*Primary Examiner*—Kristine Kincaid
*Assistant Examiner*—Dhiru R Patel
*Attorney, Agent, or Firm*—Alix, Yale & Ristas, LLP

[57] ABSTRACT

An isolation ground assembly includes a ground stud having a nut segment breakably connected to a stud segment. The ground stud has a longitudinal bore and at least first and second longitudinally spaced threaded transverse bores which intersect the longitudinal bore. Similarly, a ground connector has a longitudinal bore and at least first and second longitudinally spaced threaded transverse bores which intersect the longitudinal bore. A ground wire has a first end portion which extends into the longitudinal bore of the ground stud, via the nut segment, to a point intermediate the two transverse bores and a second end portion which extends into the longitudinal bore of the ground connector to a point intermediate the two transverse bores. Set screws disposed in the first transverse bores of the ground stud and the ground connector engage the ground wire. The ground post of an endplate is threaded into the longitudinal bore of the ground stud and engaged by a set screw disposed in the second transverse bore and the ground lead of a cable is received within the longitudinal bore of the ground connector and engaged by a set screw disposed in the second transverse bore to provide a ground path therebetween.

20 Claims, 3 Drawing Sheets

ISOLATION GROUND ASSEMBLY

BACKGROUND OF THE INVENTION

This invention relates generally to apparatus for providing a ground path for the ground lead of a cable. More particularly, the present invention relates to apparatus for providing an isolated ground path between the ground lead of a fiber optic cable and the ground post of a signal connector endplate.

Certain fiber optic cable systems utilize a constant tone technology. In this technology, a constant signal is transmitted via the shield of the fiber optic cable. If the shield is broken, the interruption in the signal path will result in the loss of the signal, indicating that there is a problem in the cable system. The constant tone technology also requires the fiber optic cable shield to be grounded at prescribed intervals, for example, at least each four miles. Generally, the fiber optic cable shield is grounded at more frequent intervals. Since multiple fiber optic cables may be grounded at the same location, the ground paths for each of the fiber optic cable shields must be shielded from each other to ensure that the signal on one of the shields is not transmitted to the shield of another cable. The presence of such a "crossover" signal could mask the presence of a problem in a cable.

Conventional apparatus and methods for providing an isolated ground path between the fiber optic cable shield and the ground post of a signal connector endplate generally require the use of many individual components which must be assembled and connected to the cable shield ground lead and the endplate ground post in a labor intensive manner in the field. The components are typically collected in kits. In addition, some of the components utilized in these kits require special tools. The accidental loss of any one of the kit components results in a useless kit and possible delay in the completion of the grounding operation. The loss of one of the special tools prevents further grounding operations until the tool is replaced.

SUMMARY OF THE INVENTION

Briefly stated, the invention in a preferred form is an isolation ground assembly for providing an isolated ground connection between a ground lead of a cable and a ground post of an endplate. The isolation ground assembly includes a ground wire having a ground stud and a ground connector mounted on oppositely disposed end portions. The ground stud has a nut segment connected to a longitudinally extending stud segment by a throat. First and second longitudinal bores extend from the end surfaces of the nut segment and stud segment, respectively. A first threaded transverse bore extends from the outer surface of the stud segment to the first longitudinal bore and a second threaded transverse bore extends from the outer surface of the stud segment to the second longitudinal bore. The ground connector has first and second bores extending longitudinally from opposite end surfaces and first and second threaded transverse bores extending from the outer surface of the ground connector to the first and second bores, respectively.

The first end portion of the ground wire is positioned within the first longitudinal bore of the ground stud and engaged by a set screw disposed in the first threaded transverse bore and the second end portion of the ground wire is disposed within the first longitudinal bore of the ground connector and engaged by a set screw disposed in the first threaded transverse bore. The ground post of the endplate is threaded into the second longitudinal bore of the ground stud and engaged by a set screw disposed in the second threaded transverse bore to mount the assembly to the endcap. The ground lead of the cable is received within the second longitudinal bore of the ground connector and engaged by a set screw disposed in the second threaded transverse bore to complete the ground path.

The ground stud may also define third and fourth threaded transverse bores extending from the outer surface of the stud segment to the first and second longitudinal bores, respectively. Similarly, the ground connector may also define third and fourth threaded transverse bores extending from the outer surface of the ground connector to the first and second longitudinal bores, respectively. Preferably, the axes of the transverse bores intersect and are substantially perpendicular to the axis of the first and second longitudinal bores of the ground stud and the ground connector. The first and second transverse bores may be disposed opposite to the third and fourth transverse bores, respectively, such that the axis of the third transverse bore is coaxial with the axis of the first transverse bore and the axis of the fourth transverse bore is coaxial with the axis of the second transverse bore. The first and second longitudinal bores of the ground stud may form an axial through bore. Similarly, the first and second longitudinal bores of the ground connector may form an axial through bore.

The throat preferably has a frustoconical shape defining a narrow end disposed adjacent the nut segment and a wide end disposed adjacent the stud segment. The narrow end of the throat has a cross-sectional area selected such that the nut segment will break away from the stud segment when a predetermined amount of torque is applied to the nut segment and the stud segment is held stationary.

The isolation ground assembly further includes first and second electrically non-conductive boots. Each of the boots defines a cavity which is filled with an electrically non-conductive gel. The ground wire extends through the boot and the boots may be slid along the ground wire such that the ground stud is received in the cavity of the first boot and the ground connector is received in the cavity of the second boot. A flexible washer is positioned intermediate the stud segment end of the ground stud and the endplate and is compressed when the ground stud is installed on the endplate ground post.

It is an object of the invention to provide a new and improved isolation ground assembly for implementing an isolated ground between the ground lead of a cable and a ground post of an endplate.

It is also an object of the invention to provide a new and improved isolation ground assembly that has fewer components than prior art devices, thereby facilitating installation of the assembly and reducing the cost of the assembly.

Other objects and advantages of the invention will become apparent from the drawings and the specification.

BRIEF DESCRIPTION OF THE DRAWINGS

The present invention may be better understood and its numerous objects and advantages will become apparent to those skilled in the art by reference to the accompanying drawings in which.

DETAILED DESCRIPTION OF THE PREFERRED EMBODIMENT

With reference to the drawings wherein like numerals represent like parts throughout the several figures, an isolation ground assembly in accordance with the present invention is generally designated by the numeral 10. The isolation ground assembly 10 provides an isolated ground path for the shield of a cable (not illustrated) such as is typically utilized in a constant tone technology system.

Figure 2:
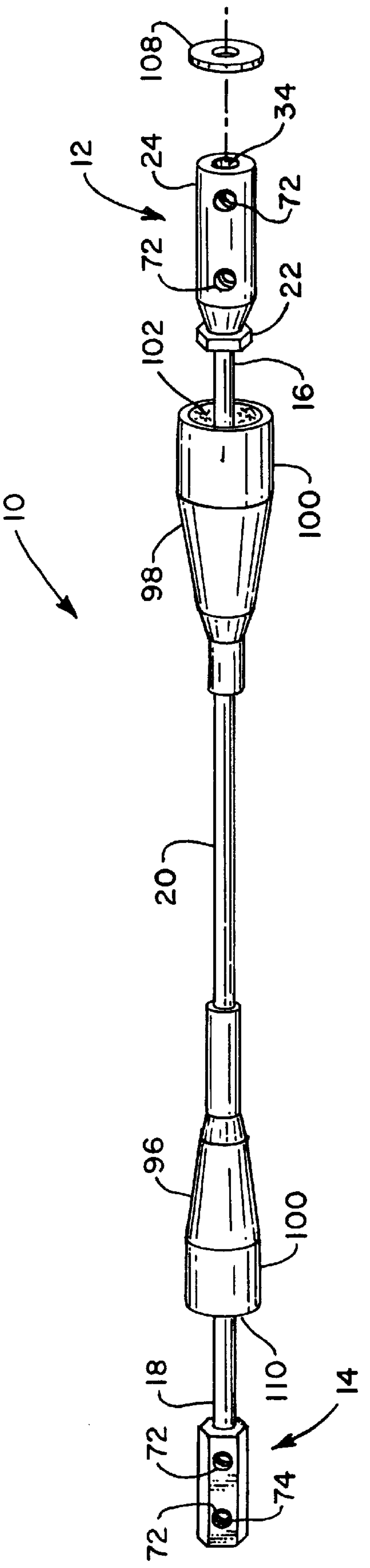
FIG. 2 is perspective view of the isolation ground assembly of FIG. 1.

With reference to FIG. 2, the isolation ground assembly 10 includes a breakaway ground stud 12 and a ground connector 14 that are mechanically and electrically mounted on opposite end portions 16, 18 of a ground wire 20. Preferably, the ground wire 20 is a #6 AWG solid copper wire to ensure that the isolation ground assembly 10 has proper current carrying capacity.

Figure 3:
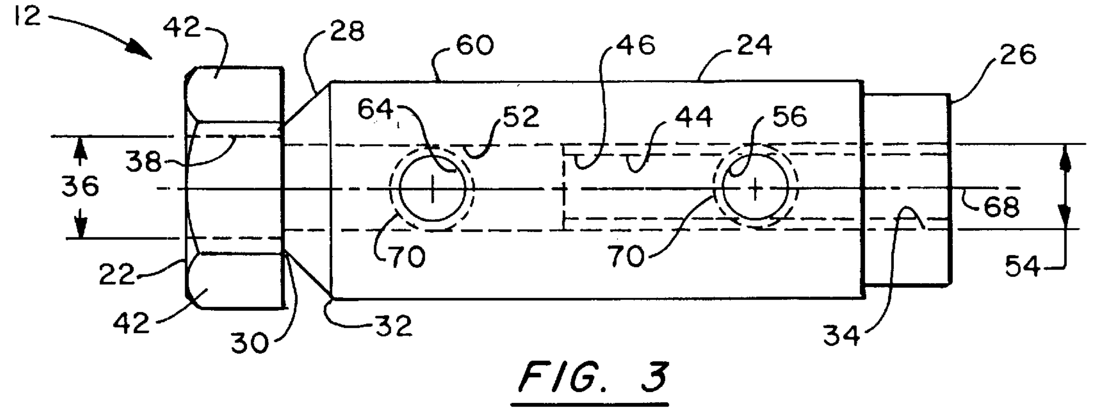
FIG. 3 is an enlarged side view, partly in phantom, of a breakaway ground stud for the ground assembly of FIG. 2.
Figure 4:
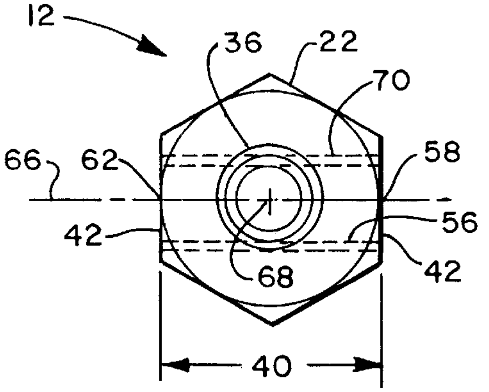
FIG. 4 is an end view of the breakaway ground stud of FIG. 3 viewed from the left thereof.

With additional reference to FIGS. 3 and 4, the breakaway ground stud 12 is composed of an electrically conductive material and has a hexagonal nut segment 22 and a substantially cylindrical stud segment 24 which extends from the nut segment 22 to a distal end 26. A frustoconical-shaped throat 28 integrally joins the nut segment 22 to the stud segment 24. The cross-sectional area of the narrow end 30 of the throat 28 is selected such that the nut segment 22 will separate, or break-away, from the stud segment 24 when forty (40) inch pounds of force is applied to the nut segment 22 while the stud segment 24 is held stationary. Preferably, the narrow end 30 of the throat 28 is disposed adjacent the nut segment 22 and has an outside diameter of 0.300 inches and the wide end 32 of the throat 28 is disposed adjacent the stud segment 24. An axial bore 34 extends longitudinally through the nut segment 22, the throat 28, and the stud segment 24 and preferably has an inside diameter of 0.196 inches adjacent the narrow end 30 of the throat 28.

The diameter 36 of the nut portion 38 of bore 34 is sufficiently greater than the outside diameter of the ground wire 20 (including insulation) to allow the nut segment 22 to rotate freely around the ground wire 20 during installation of the isolation ground assembly 10. The distance 40 between the flats 42 of the nut segment 22 is selected such that the nut segment 22 may be received within a standard open-end wrench, for example a 9⁄16 inch wrench.

Figure 1:
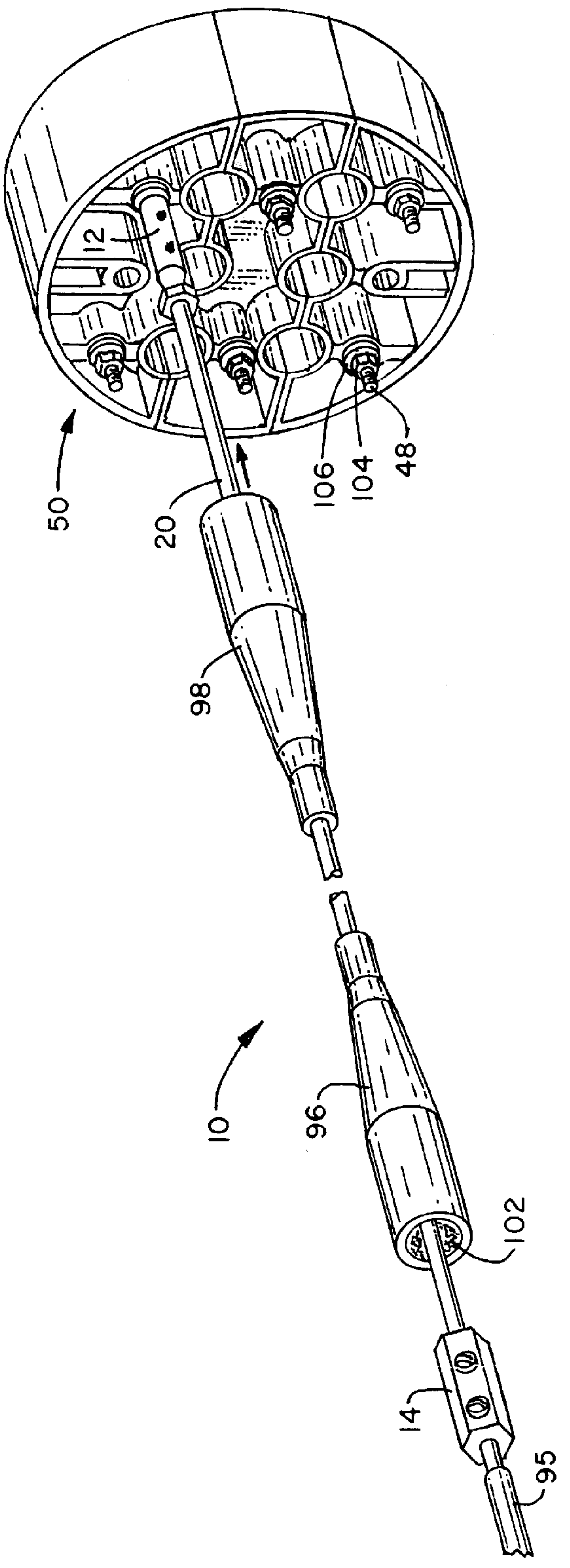
FIG. 1 is a perspective view, partly broken away, of an isolation ground assembly in accordance with the invention installed on a ground post of an end plate.

At least a portion 46 of the bore 44 in the stud segment 24 has a threaded surface extending from the distal end 26 of the stud segment 24 for threadably mounting the breakaway ground stud 12 to the ground post 48 of an end plate 50 (FIG. 1). To reduce manufacturing costs, the bore 44 in the stud segment 24 may also include an unthreaded portion 52 disposed intermediate the threaded portion 46 and the throat 28. The diameter 54 of the threaded portion 46 and the thread are selected to provide proper threaded engagement with the end plate ground post 48. Preferably, the diameter of the unthreaded portion 52 is substantially equal to the diameter 54 of the threaded portion 46 for manufacturing efficiency.

A first transverse bore 56 extends from a first point 58 on the outer surface 60 of the stud segment 24 to an opposite point 62 on the outer surface 60, through the threaded portion 46 of bore 44. Similarly, a second transverse bore 64 extends through the unthreaded portion 52 of bore 44. Preferably, each transverse bore 56, 64 has an axis 66 which intersects and is perpendicular to the axis 68 of bore 34. The transverse bores 56, 64 each have a threaded surface 70 for threadably mounting a set screw 72 (FIG. 2). Alternatively, four blind bores may extend from the outer surface 60 of the stud segment 24 and intersect the bore 34, similar to the ground connector as described below.

The exterior end of the set screws 72 may have a slot 74 for receiving the blade of a screwdriver or a hexagonal-shaped recess for receiving a hex key. Set screws 72 are threaded into transverse bore 64 from the opposite points 58, 62 on the surface 60 until the interior end of each set screw 72 engages the first end portion 16 of the ground wire 20 to clamp the ground wire 20 therebetween and thereby mount the ground stud 12 to the ground wire 20. Set screws 72 may be threaded into transverse bore 56 from the opposite surfaces until the interior end of each set screw 72 engages the end plate ground post 48 to prevent rotation of the ground stud 12 which could lead to inadvertent disengagement between the stud segment 24 and the end plate ground post 48.

Figure 5:
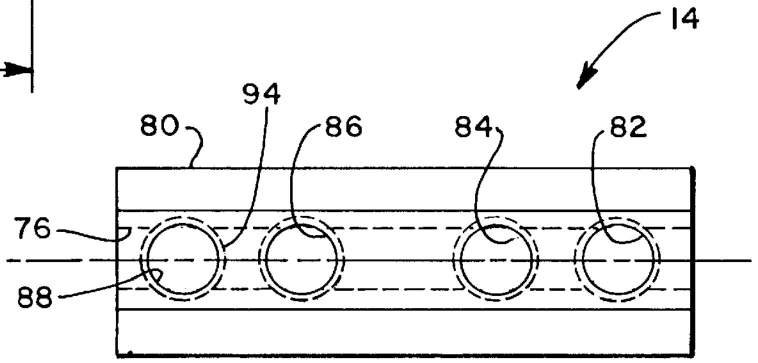
FIG. 5 is an enlarged side view, partly in phantom, of a ground connector for the ground assembly of FIG. 2.
Figure 6:
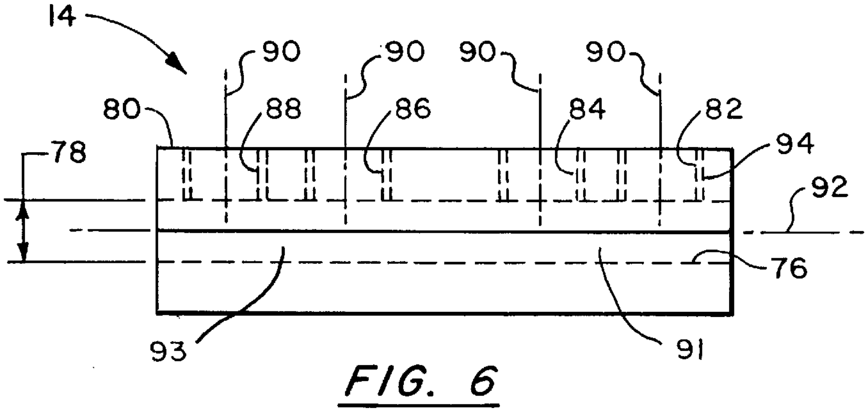
FIG. 6 is bottom view, partly in phantom, of the ground connector of FIG. 5.

With reference to FIGS. 2, 5 and 6, the ground connector 14 is a longitudinally extending, electrical-conductive member having an axial bore 76. The bore 76 has a diameter 78 which facilitates the insertion of a #6 AWG solid wire, preferably 0.180 inches. The ground connector 14 may have a hexagonal-shaped outer surface 80, as shown in FIGS. 1, 5 and 6. Alternatively, the outer surface 80 may have a cylindrical shape. Four blind bores 82, 84, 86, 88 extend from the outer surface 80 of the ground connector 14 and intersect the bore 76. Preferably, each blind bore 82, 84, 86, 88 has an axis 90 which intersects and is perpendicular to the axis 92 of bore 76. Each blind bore 82, 84, 86, 88 has a threaded surface 94 for threadably mounting a set screw 72. Alternatively, a pair of transverse bores may extend through the ground connector similar to the ground stud 12 as described above.

The inboard pair of set screws 72 are threaded into blind bores 82 and 84 until the interior end of each set screw engages the second end portion 18 of the ground wire 20 to clamp the ground wire 20 in A1 the bore 76 and thereby mount the ground connector 14 to the ground wire 20. The outboard pair of set screws 72 may be threaded into blind bores 86 and 88 until the interior end of each set screw 72 engages a ground lead 95 of a cable to clamp the ground lead 95 in A2 the bore 76 and thereby mount the ground connector 14 to the ground lead 95.

With reference to FIGS. 1 and 2, a pair of hollow, conical-shaped boots 96, 98, or covers, are open at each end. The boots 96, 98 are oppositely oriented and are slidably received and displaceable on the ground wire (see FIG. 1) such that the boots 96, 98 may be positioned with the ground connector 14 disposed within the base portion 100 of boot 96 and the ground stud 12 disposed within the base portion 100 of boot 98. Each boot 96, 98 is composed of an electrically non-conductive material and is filled with an electrically non-conductive gel 102. The gel 102 encapsulates and water-proofs the ground connector 14 and the ground stud 12.

To install the isolation ground assembly 10, the technician removes and discards the nuts 104 and washer 106 that are typically installed on the endplate ground post 48. A flexible washer 108 is inserted onto the endplate ground post 48 and the stud segment 24 of the ground stud 12 is threaded onto the endplate ground post 48. A torque is applied to the nut segment 22 with a wrench until the throat 28 parts and the nut segment 22 breaks off of the stud segment 24. This ensures that the proper torque is applied and that the flexible washer 108 is compressed to apply a preload on the thread connection which resists loosening of the ground stud 12. Set screws 72 are tightened until the interior end engages the endplate ground post 48. This further ensures that the ground stud 12 will not loosen or back off from the endplate ground post 48. Boot 98 is filled with gel 102 and slid towards the endplate 50 to position the ground stud 12 within the boot 98. The end portion of the ground lead 95 is inserted into the bore 76 of the ground connector 14 and set screws 72 are tightened until the interior end engages the ground lead 95. Boot 96 is filled with gel 102 and slid away from the endplate 50 to position the ground connector 14 within the boot 96. The open base end 110 of boot 96 is closed with vinyl or other electrically non-conductive tape to complete the installation.

It should be appreciated that the design of the subject invention requires fewer components than prior art devices and that the subject invention is fully assembled in the factory with the exception of the flexible washer. Consequently, the subject invention is cheaper to produce and requires less labor for installation than prior art devices.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An isolation ground assembly for providing an isolated ground connection between a ground lead of a cable and a threaded ground post of an endplate, the assembly comprising:

a ground stud including a nut segment connected to a longitudinally extending stud segment by a throat, the nut segment and stud segment defining first and second opposite ends of the ground stud, the stud segment having an outer surface, the ground stud defining a longitudinal bore having first and second portions extending from the first and second ends of the ground stud, respectively, a first threaded transverse bore extending from the outer surface of the stud segment to the first portion, and a second threaded transverse bore extending from the outer surface of the stud segment to the second portion, the second portion having a threaded surface, the ground stud further including a plurality of set screws, one of said set screws being threadably positionable in each of the threaded transverse bores;

a longitudinally extending ground connector including an outer surface and oppositely disposed first and second ends, the ground connector defining a longitudinal bore having first and second segments extending from the first and second ends, respectively, and first and second threaded transverse openings extending from the outer surface of the ground connector to the first and second segments, respectively, the ground connector further including a plurality of set screws, one of the set screws being threadably positionable in each of the threaded transverse openings; and a ground wire having oppositely disposed first and second end portions, the first end portion of the ground wire being disposed within the first portion of the longitudinal bore of the ground stud and engaged by the set screw disposed in the first threaded transverse bore, the second end portion of the ground wire being disposed within the first segment of the longitudinal bore of the ground connector and engaged by the set screw disposed in the first threaded transverse opening;

wherein the ground post of the endplate is threadably receivable within the second portion of the longitudinal bore of the ground stud and engageable by the set screw disposed in the second threaded transverse bore and the ground lead of the cable is receivable within the second segment of the longitudinal bore of the ground connector and engageable by the set screw disposed in the second threaded transverse opening.

2. The isolation ground assembly of claim 1 wherein the longitudinal bore of the ground stud is an axial through bore.

3. The isolation ground assembly of claim 1 wherein the longitudinal bore of the ground connector is an axial through bore.

4. The isolation ground assembly of claim 1 wherein the ground connector further defines a third threaded transverse bore extending from the outer surface of the stud segment to the first portion of the longitudinal bore, and a fourth threaded transverse bore extending from the outer surface of the stud segment to the second portion of the longitudinal bore, and one of said set screws is threadably positionable in the third and fourth threaded transverse bores.

5. The isolation ground assembly of claim 4 wherein the first and second segments of the longitudinal bore of the ground connector and the first, second, third and fourth transverse bores each define an axis, the axes of the first and third transverse bores intersecting and being substantially perpendicular to the axis of the first segment of longitudinal bore of the ground connector and the axes of the second and fourth transverse bores intersecting and being substantially perpendicular to the axis of the second segment of the longitudinal bore of the ground connector.

6. The isolation ground assembly of claim 5 wherein the axis of the third transverse bore is coaxial with the axis of the first transverse bore and the axis of the fourth transverse bore is coaxial with the axis of the second transverse bore.

7. The isolation ground assembly of claim 1 wherein the throat has a frustoconical shape defining a narrow end and a wide end, the narrow end of the throat having a cross-sectional area selected so that the nut segment will break away from the stud segment when a predetermined amount of torque is applied to the nut segment when the stud segment is held stationary.

8. The isolation ground assembly of claim 1 wherein the ground connector further defines a third threaded transverse opening extending from the outer surface of the ground connector to the first segment of the longitudinal bore, and a fourth threaded transverse opening extending from the outer surface of the ground connector to the second segment of the longitudinal bore, and one of said set screws is threadably positionable in the third and fourth threaded transverse openings.

9. The isolation ground assembly of claim 4 wherein the first and second segments of the longitudinal bore of the ground connector and the first, second, third and fourth transverse openings each define an axis, the axes of the first and third transverse openings intersecting and being substantially perpendicular to the axis of the first segment of the longitudinal bore of the ground connector and the axes of the second and fourth transverse openings intersecting and being substantially perpendicular to the axis of the second segment of the longitudinal bore of the ground connector.

10. The isolation ground assembly of claim 1 further comprising first and second boots composed of electrically non-conductive material, each of the boots defining a cavity, the ground stud being received in the cavity of the first boot and the ground connector being received in the cavity of the second boot.

11. The isolation ground assembly of claim 10 wherein each of the boots has a conical-shape defining oppositely disposed open narrow and wide ends, the boots being slidably disposed around the ground wire, wherein the first and second boots are slidable along the ground wire to receive the ground stud and the ground connector, respectively, through the wide end.

12. The isolation ground assembly of claim 10 further comprising an electrically non-conductive gel disposed within each of the boots.

13. The isolation ground assembly of claim 1 further comprising a flexible washer disposabl e intermediate the second end of the ground stud and the endplate.

14. An isolation ground assembly for providing an isolated ground connection between a ground lead of a cable and a ground post of an endplate, the assembly comprising:

a ground stud including a nut segment breakably connected to a longitudinally extending stud segment, the ground stud defining a longitudinal bore, the stud segment defining at least first and second longitudinally spaced threaded transverse bores intersecting the longitudinal bore, at least a portion of the longitudinal bore of the stud segment having a threaded surface;

a longitudinally extending ground connector having oppositely disposed first and second ends and defining a longitudinal bore and at least first and second longitudinally spaced threaded transverse openings intersecting the longitudinal bore;

a plurality of set screws, one of the set screws being threadably positionable in each of the threaded traverse bores and threaded transverse openings; and a ground wire having oppositely disposed first and second end portions, the first end portion of the ground wire extending into the longitudinal bore of the ground stud through the nut segment and engaged by the set screw disposed in the first threaded transverse bore, the second end portion of the ground wire extending into the longitudinal bore of the ground connector through the first end and engaged by the set screw disposed in the first threaded transverse opening;

wherein the ground post of the endplate is receivable within the longitudinal bore of the ground stud and engageable by the set screw disposed in the second threaded transverse bore and the ground lead of the cable is receivable within the longitudinal bore of the ground connector and engageable by the set screw disposed in the second threaded transverse opening.

15. The isolation ground assembly of claim 14 wherein the stud segment of the ground stud further defines third and fourth threaded transverse bores intersecting the longitudinal bore, the third and fourth threaded transverse bores being disposed intermediate the first and second threaded transverse bores, the longitudinal bore of the ground stud and each threaded transverse bore defining an axis, the axes of the threaded transverse bores intersecting and being substantially perpendicular to the axis of the longitudinal bore of the ground stud.

16. The isolation ground assembly of claim 14 wherein the ground stud further includes a throat connecting the nut segment to the stud segment, at least one portion of the throat having a cross-sectional area selected so that the nut segment will break away from the stud segment when a predetermined amount of torque is applied to the nut segment when the stud segment is held stationary.

17. The isolation ground assembly of claim 14 wherein the ground connector further defines third and fourth threaded transverse openings intersecting the longitudinal bore of the ground connector, and one of said set screws is threadably positionable in each of the third and fourth threaded transverse openings.

18. The isolation ground assembly of claim 17 wherein the longitudinal bore of the ground connector and the first, second, third and fourth transverse openings each define an axis, the axes of the threaded transverse openings intersecting and being substantially perpendicular to the axis of the longitudinal bore of the ground connector.

19. The isolation ground assembly of claim 14 further comprising first and second electrically non-conductive boots disposed on the ground wire, the first and second boots being slidable along the ground wire to receive the ground stud and the ground connector, respectively.

20. The isolation ground assembly of claim 19 further comprising an electrically non-conductive gel disposed within each of the boots and a flexible washer disposable intermediate the stud segment of the ground stud and the endplate.

* * * * *